US012765134B2

(12) United States Patent
Tsai et al.

(10) Patent No.: US 12,765,134 B2
(45) Date of Patent: Oct. 13, 2026

(54) TRANSPARENT DISPLAY APPARATUS

(71) Applicant: AUO Corporation, Hsinchu (TW)

(72) Inventors: YuTang Tsai, Hsinchu (TW); Jia Hao Hsu, Hsinchu (TW); Kun-Cheng Tien, Hsinchu (TW); Chien-Huang Liao, Hsinchu (TW); Chin-An Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 462 days.

(21) Appl. No.: 18/523,913

(22) Filed: Nov. 30, 2023

(65) Prior Publication Data

US 2025/0040315 A1 Jan. 30, 2025

(30) Foreign Application Priority Data

Jul. 28, 2023 (TW) ................................ 112128292

(51) Int. Cl.
*H10H 20/851* (2025.01)
*H10W 90/00* (2026.01)

(52) U.S. Cl.
CPC ........ *H10H 20/8514* (2025.01); *H10W 90/00* (2026.01)

(58) Field of Classification Search
None
See application file for complete search history.

(56) References Cited

U.S. PATENT DOCUMENTS 9,442,338 B2 9/2016 Uhm et al.
2016/0327853 A1 11/2016 Sarma et al.

FOREIGN PATENT DOCUMENTS

CN 106125486 11/2016
CN 104122729 4/2017
CN 211878375 11/2020
CN 114361369 9/2023

*Primary Examiner* — Aneeta Yodichkas
(74) *Attorney, Agent, or Firm* — JCIPRNET

(57) ABSTRACT

A transparent display apparatus includes a first transparent substrate, first to third light-emitting elements, and a first frequency band blocking filter. The first transparent substrate has a first display area and a first transparent area outside the first display area. The first to third light-emitting elements are disposed at the first display area and respectively used for emitting first to third color lights. The first frequency band blocking filter is disposed on a transmission path of the first to third color lights. The first frequency band blocking filter has first to third blocking bands respectively corresponding to the first to third color lights. FWHM of the first to third blocking bands fall in a range of 15 nm to 55 nm.

14 Claims, 14 Drawing Sheets

TRANSPARENT DISPLAY APPARATUS

CROSS-REFERENCE TO RELATED APPLICATION

This application claims the priority benefit of Taiwan application serial no. 112128292, filed on Jul. 28, 2023. The entirety of the above-mentioned patent application is hereby incorporated by reference herein and made a part of this specification.

BACKGROUND OF THE INVENTION

Field of the Invention

The invention relates to a display apparatus, and in particular to a transparent display apparatus.

Description of Related Art

A transparent display apparatus refers to a display apparatus that may provide a transparent display state for the user to see behind the transparent display apparatus, and is commonly found in showcases, vending machines, etc. The transparent display apparatus has a display area and a transparent area, wherein the display area may provide a display screen for the user to view, and the transparent area is transparent so that the user may see behind the transparent display apparatus. Pixels are provided in the display area to emit image beams toward the display surface of the transparent display apparatus to provide a screen. However, a portion of the image beam is reflected back into the transparent display apparatus at the interface between the display surface and the outside world, and then passes out from the back of the transparent display apparatus, causing a backside light leakage issue.

SUMMARY OF THE INVENTION

The invention provides a transparent display apparatus that may alleviate the backside light leakage issue.

A transparent display apparatus of the invention includes a first transparent substrate, a first light-emitting element, a second light-emitting element, a third light-emitting element, and a first frequency band blocking filter. The first transparent substrate has a first display area and a first transparent area outside the first display area. The first light-emitting element, the second light-emitting element, and the third light-emitting element are disposed at the first display area and respectively used for emitting a first color light, a second color light, and a third color light. The first frequency band blocking filter is disposed on a transmission path of the first color light, the second color light, and the third color light. The first frequency band blocking filter has a first blocking band, a second blocking band, and a third blocking band respectively corresponding to the first color light, the second color light, and the third color light, and an FWHM of the first blocking band, an FWHM of the second blocking band, and an FWHM of the third blocking band fall within a range of 15 nm to 55 nm.

DESCRIPTION OF THE EMBODIMENTS

Figure 1:
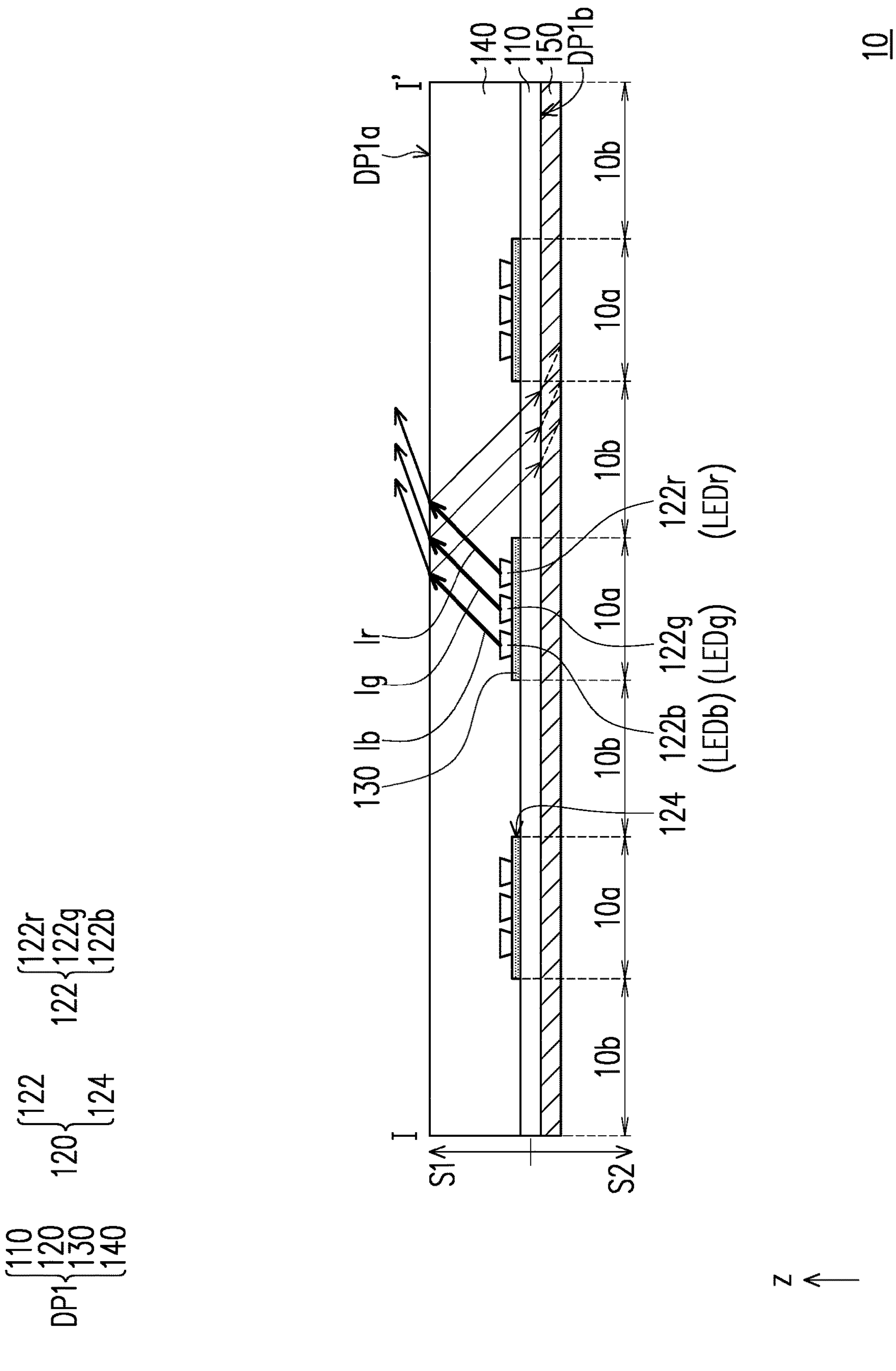
FIG. 1 is a schematic cross-sectional view of a transparent display apparatus of an embodiment of the invention.

Reference will now be made in detail to the exemplary embodiments of the invention, and examples of the exemplary embodiments are illustrated in the accompanying drawings. Wherever possible, the same reference numerals are used in the figures and the descriptions to refer to the same or similar portions.

It should be understood that when an element such as a layer, film, region, or substrate is referred to as being "on" or "connected to" another element, it may be directly on or connected to the other element, or an intermediate element may also be present. On the other hand, when an element is "directly on another device" or "directly connected to" another element, an intermediate element is not present. As used in the present specification, "connected to" may refer to a physical and/or electrical connection. Furthermore, "electrically connected" or "coupled" may mean that other elements are present between two elements.

As used herein, "about", "approximately", or "substantially" includes the stated value and the average within an acceptable deviation range for the particular value as determined by one of ordinary skill in the art, taking into account the measurements in question and the specific amount of error associated with the measurements (i.e., limitations of the measurement system). For example, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

Figure 2:
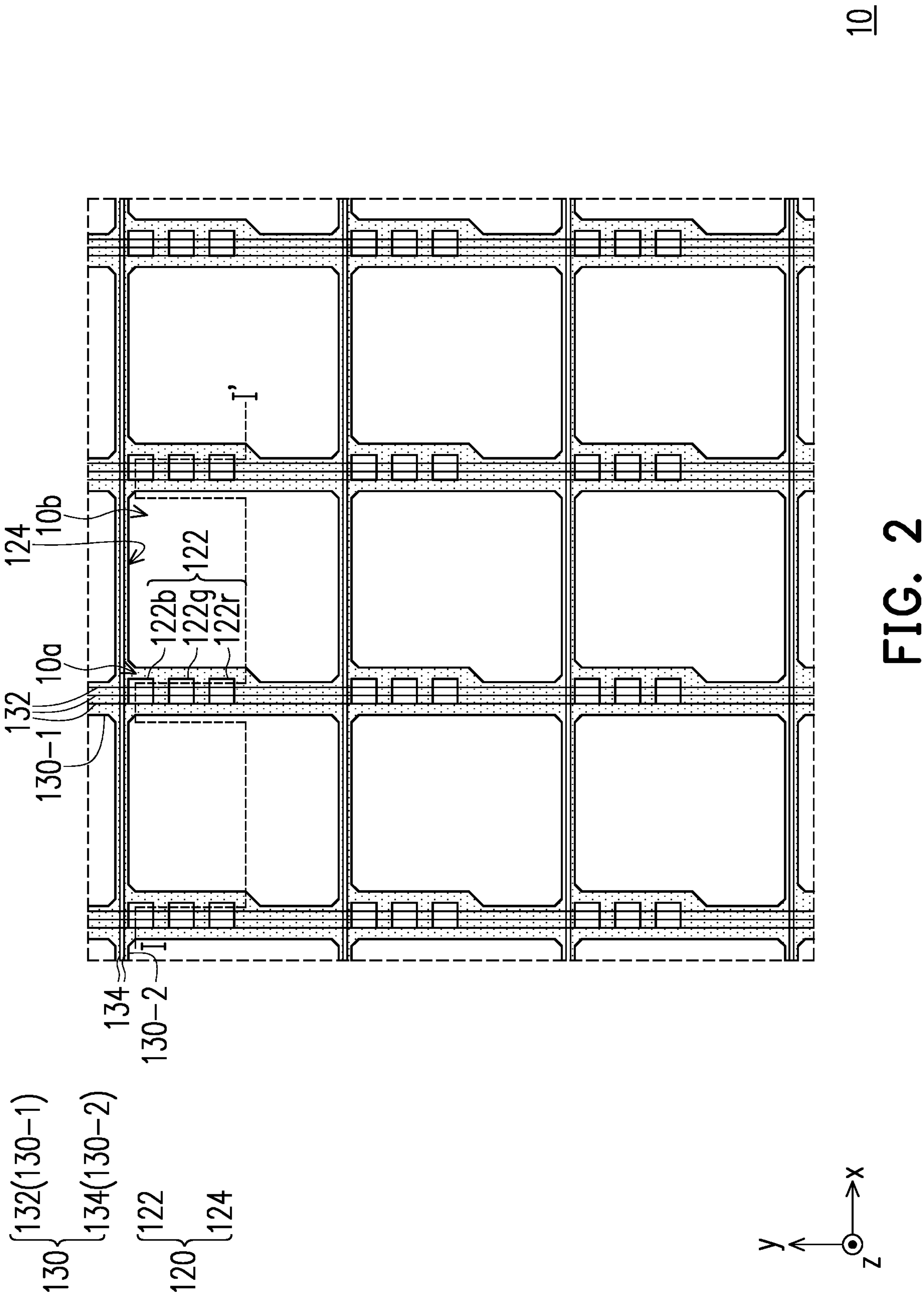
FIG. 2 is a schematic top view of a transparent display apparatus of an embodiment of the invention.

FIG. 1 is a schematic cross-sectional view of a transparent display apparatus 10 of an embodiment of the invention. FIG. 2 is a schematic top view of the transparent display apparatus 10 of an embodiment of the invention. FIG. 1 corresponds to section line I-I' of FIG. 2. FIG. 2 omits a first frequency band blocking filter 150 of FIG. 1.

Referring to FIG. 1 and FIG. 2, the transparent display apparatus 10 includes a first transparent display panel DP1. The first transparent display panel DP1 includes a first transparent substrate 110, a first pixel array 120, and a first circuit structure 130. The first circuit structure 130 includes a plurality of signal lines 132 and 134 and is substantially opaque. The first transparent substrate 110 has a plurality of first display areas 10*a* and a plurality of first transparent areas 10*b* outside the plurality of first display areas 10*a*. In an embodiment, the plurality of first transparent areas 10*b* respectively include a plurality of areas of the first transparent substrate 110 not occupied by the first circuit structure 130, and the plurality of first display areas 10*a* respectively include a plurality of areas of the first transparent substrate 110 occupied by the first circuit structure 130. For example, in an embodiment, in a top view of the transparent display apparatus 10, the first circuit structure 130 is generally a mesh structure, the mesh structure includes a plurality of longitudinal portions 130-1 and a plurality of transverse portions 130-2 intersected with each other, the plurality of first display areas 10*a* may respectively correspond to the plurality of intersections of the plurality of longitudinal portions 130-1 and the plurality of transverse portions 130-2, and the plurality of first transparent areas 10*b* may respectively correspond to a plurality of meshes of the mesh structure, but the invention is not limited thereto. In an embodiment, the material of the first transparent substrate 110 is, for example, glass. However, the invention is not limited thereto. In other embodiments, the material of the first transparent substrate 110 may also be quartz, organic polymer, or other applicable materials.

The first pixel array 120 is disposed on the first transparent substrate 110. The first pixel array 120 includes a plurality of first pixels 122 and a plurality of first openings 124. The plurality of first pixels 122 are arranged in an array along a first direction y and a second direction x, wherein the first direction y and the second direction x are intersected. For example, in an embodiment, the first direction y and the second direction x may be perpendicular to each other, but the invention is not limited thereto. Each of the first pixels 122 is overlapped with one corresponding first display area 10*a* in a third direction z, wherein the third direction z is perpendicular to the first direction y and the second direction x. Each of the first openings 124 is surrounded by the plurality of first pixels 122, and each of the first openings 124 is overlapped with one corresponding first transparent area 10*b* in the third direction z. For example, in an embodiment, each of the first openings 124 may be a closed opening, but the invention is not limited thereto.

In an embodiment, each of the first pixels 122 may include a plurality of sub-pixels 122*r*, 122*g*, and 122*b* respectively used for emitting a first color light lr, a second color light lg, and a third color light lb. For example, in an embodiment, the sub-pixels 122*r*, 122*g*, and 122*b* respectively include a first light-emitting element LEDr, a second light-emitting element LEDg, and a third light-emitting element LEDb, wherein the first color light lr, the second color light lg, and the third color light lb respectively emitted by the first light-emitting element LEDr, the second light-emitting element LEDg, and the third light-emitting element LEDb may be red light, green light, and blue light respectively. However, the invention is not limited thereto.

The plurality of signal lines 132 and 134 of the first circuit structure 130 are disposed on the first transparent substrate 110 and electrically connected to the plurality of first pixels 122. The signal lines 132 and 134 may be any wires used for driving the first pixels 122. In an embodiment, the first circuit structure 130 also includes a plurality of sub-pixel driving circuits (not shown), and each of the first light-emitting element LEDr, the second light-emitting element LEDg, and the third light-emitting element LEDb of each of the first pixels 122 is electrically connected to a corresponding sub-pixel driving circuit. For example, each of the sub-pixel driving circuits may include a first transistor (not shown), a second transistor (not shown), and a capacitor (not shown), the second terminal of the first transistor is electrically connected to the control terminal of the second transistor, the capacitor is electrically connected to the second terminal of the first transistor and the first terminal of the second transistor, the first electrode (not shown) of the first light-emitting element LEDr, the second light-emitting element LEDg, or the third light-emitting element LEDb is electrically connected to the second terminal of the second transistor, and the plurality of signal lines 132 and 134 may include a data line electrically connected to the first terminal of the first transistor, a scan line electrically connected to the control terminal of the first transistor, and a power cable electrically connected to the first terminal of the second transistor. In an embodiment, the first light-emitting element LEDr, the second light-emitting element LEDg, and the third light-emitting element LEDb are, for example, micro light-emitting diode elements (μLED), but the invention is not limited thereto.

Please refer to FIG. 1. In an embodiment, the first transparent display panel DP1 further includes a first transparent packaging element 140 disposed on the first transparent substrate 110 and covering the plurality of first pixels 122. The first transparent packaging element 140 has a light exit surface DP1*a* of the first transparent display panel DP1, and the light exit surface DP1*a* faces away from the first pixels 122. Most of the first color light lr, the second color light lg, and the third color light lb emitted by the first light-emitting element LEDr, the second light-emitting element LEDg, and the third light-emitting element LEDb of the first transparent display panel DP1 leave the first transparent display panel DP1 via the light exit surface DP1*a*, thereby providing the user with a display screen. The light exit surface DP1*a* is the front surface of the first transparent display panel DP1. The first transparent substrate 110 has a backside DP1*b* of the first transparent display panel DP1, and the backside DP1*b* faces away from the first pixels 122. For example, in an embodiment, the first transparent packaging element 140 may include a transparent encapsulant covering the plurality of first pixels 122. However, the invention is not limited thereto. In another embodiment, the first transparent packaging element 140 also includes a transparent encapsulant covering the plurality of first pixels 122 and a transparent protective cover disposed on the transparent encapsulant.

It is worth noting that the transparent display apparatus 10 also includes the first frequency band blocking filter 150 disposed on the transmission path of the first color light lr, the second color light lg, and the third color light lb. A portion of the first color light lr, a portion of the second color light lg, and a portion of the third color light lb are reflected from the light exit surface DP1*a* of the first transparent display panel DP1 to the backside DP1*b* of the first transparent display panel DP1, thus causing backside light leakage issue of the transparent display apparatus 10. The first frequency band blocking filter 150 is used for preventing the first color light lr, the second color light lg, and the third color light lb from leaking to the outside from the backside DP1*b* of the first transparent display panel DP1, thereby alleviating the backside light leakage issue.

Referring to FIG. 1, in an embodiment, the first transparent substrate 110 has a first side S1 and a second side S2 opposite to each other, the first light-emitting element LEDr, the second light-emitting element LEDg, and the third light-emitting element LEDb emit the first color light lr, the second color light lg, and the third color light lb toward the first side S1, and the first frequency band blocking filter 150 may be optionally disposed at the second side S2 of the first transparent substrate 110. For example, in an embodiment, the first frequency band blocking filter 150 may be directly disposed on the backside DP1*b* of the first transparent display panel DP1, but the invention is not limited thereto.

Figure 3:
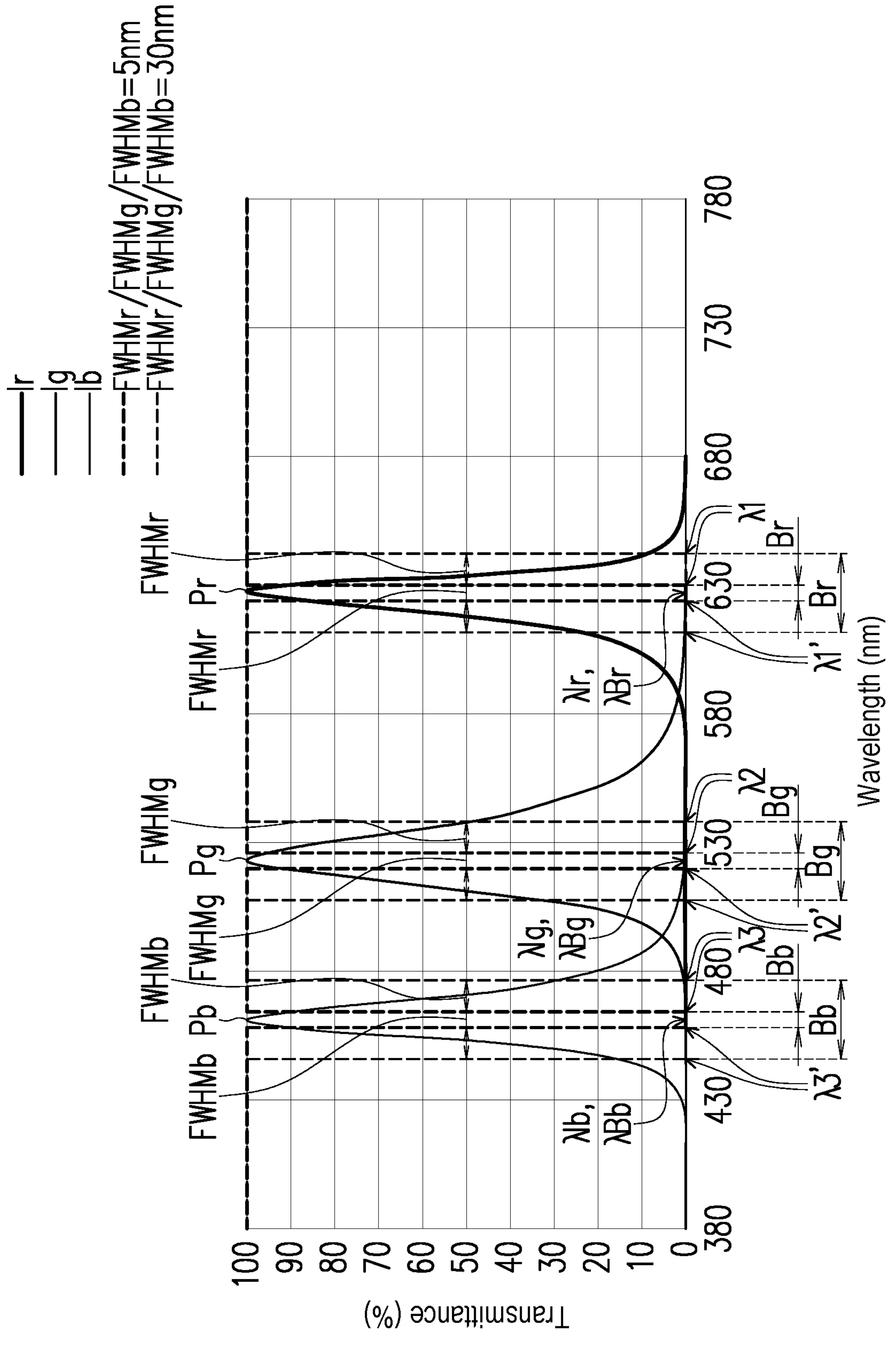
FIG. 3 shows the emission spectra of a first color light, a second color light, and a third color light emitted by a first light-emitting element, a second light-emitting element, and a third light-emitting element and the transmission spectra of a first frequency band blocking filter of an embodiment of the invention.

FIG. 3 shows the emission spectra of the first color light lr, the second color light lg, and the third color light lb emitted by the first light-emitting element LEDr, the second light-emitting element LEDg, and the third light-emitting element LEDb and the transmission spectrum of the first frequency band blocking filter 150 of an embodiment of the invention.

Referring to FIG. 1 and FIG. 3, the first frequency band blocking filter 150 has a first blocking band Br, a second blocking band Bg, and a third blocking band Bb corresponding to the first color light lr, the second color light lg, and the third color light lb respectively, the first blocking band Br has an FWHMr, the second blocking band Bg has an FWHMg, and the third blocking band Bb has an FWHMb. FIG. 3 shows the transmission spectrum of the first frequency band blocking filter 150 when the FWHMr of the first blocking band Br, the FWHMg of the second blocking band Bg, and the FWHMb of the third blocking band Bb are 5 nm. FIG. 3 also shows the transmission spectrum of the first frequency band blocking filter 150 when the FWHMr of the first blocking band Br, the FWHMg of the second blocking band Bg, and the FWHMb of the third blocking band Bb are 30 nm.

Figure 4:
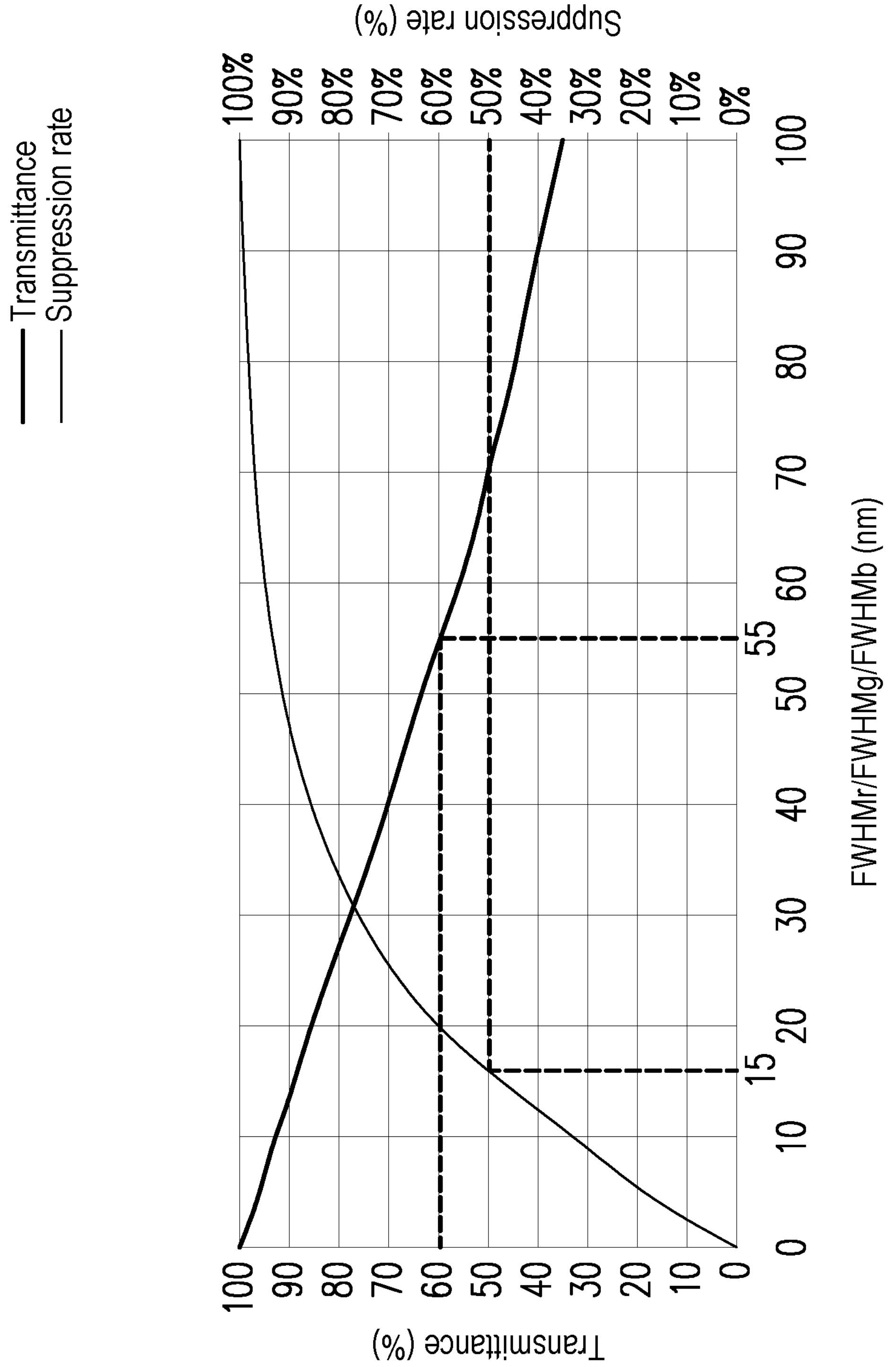
FIG. 4 shows the relationship between FWHM of a first blocking band, a second blocking band, and a third blocking band of the first frequency band blocking filter and a transmittance of a transparent display apparatus of an embodiment of the invention.

FIG. 4 shows the relationship between the FWHMr, the FWHMg, and the FWHMb of the first blocking band Br, the second blocking band Bg, and the third blocking band Bb of the first frequency band blocking filter 150 and the transmittance of the transparent display apparatus 10 of an embodiment of the invention. FIG. 4 also shows the relationship between the FWHMr, FWHMg, and FWHMb of the first blocking band Br, the second blocking band Bg, and the third blocking band Bb of the first frequency band blocking filter 150 and the suppression rate of backside light leakage of the transparent display apparatus 10 of an embodiment of the invention.

Referring to FIG. 1, FIG. 3, and FIG. 4, the first blocking band Br, the second blocking band Bg, and the third blocking band Bb of the first frequency band blocking filter 150 respectively correspond to a first peak value Pr, a second peak value Pg, and a third peak value Pb of the emission spectra of the first color light lr, the second color light lg, and the third color light lb of the first transparent display panel DP1. The greater the FWHMr, FWHMg, and FWHMb of the first blocking band Br, the second blocking band Bg, and the third blocking band Bb, the more significant the effect of the first frequency band blocking filter 150 in suppressing backside light leakage of the transparent display apparatus 10. However, the transmittance of the transparent display apparatus 10 is compromised. Therefore, a balance needs to be struck between suppressing backside light leakage and considering the transmittance of the transparent display apparatus 10. Specifically, in practical applications, it is expected that the suppression rate of the first frequency band blocking filter 150 is greater than or equal to 50%, and the transmittance of the transparent display apparatus 10 may be maintained at 60% or above. Please refer to FIG. 3 and FIG. 4, under the premise that the suppression rate of the first frequency band blocking filter 150 is greater than or equal to 50% and the transmission rate of the transparent display apparatus 10 is greater than or equal to 60%, the FWHMr of the first blocking band Br, the FWHMg of the second blocking band Bg, and the FWHMb of the third blocking band Bb should fall within the range of 15 nm to 55 nm.

Please refer to FIG. 1, FIG. 3 and FIG. 4. The emission spectrum of the first color light lr has the first peak value Pr at a first emission center wavelength λlr. The transmission spectrum of the first frequency band blocking filter 150 has a first blocking center wavelength λBr at the first blocking band Br. The first blocking band Br of the first frequency band blocking filter 150 has a transmittance of 50% at a wavelength λ1 and a wavelength λ1', and the first blocking center wavelength λBr of the first blocking band Br=(λ1'+λ1)/2. The emission spectrum of the second color light lg has a second peak value Pg at the second emission center wavelength λlg. The transmission spectrum of the first frequency band blocking filter 150 has a second blocking center wavelength λBg at the second blocking band Bg. The second blocking band Bg of the first frequency band blocking filter 150 has a transmittance of 50% at a wavelength λ2 and a wavelength λ2', and the second blocking center wavelength λBg of the second blocking band Bg=(λ2'+λ2)/2. The emission spectrum of the third color light lb has a third peak value Pb at a third emission center wavelength λlb. The transmission spectrum of the first frequency band blocking filter 150 has a third blocking center wavelength λBb at the third blocking band Bb. The third blocking band Bb of the first frequency band blocking filter 150 has a transmittance of 50% at a wavelength λ3 and a wavelength λ3', and the third blocking center wavelength λBb of the third blocking band Bb=(λ3'+λ3)/2.

Ideally, the first blocking center wavelength λBr of the first blocking band Br of the first frequency band blocking filter 150, the second blocking center wavelength λBg of the second blocking band Bg of the first frequency band blocking filter 150, and the third blocking center wavelength λBb of the third blocking band Bb of the first frequency band blocking filter 150 are respectively consistent with the first emission center wavelength λlr of the first color light lr, the second emission center wavelength λlg of the second color light lg, and the third emission center wavelength λlb of the third color light lb.

However, the invention is not limited thereto. In another embodiment, the first blocking center wavelength λBr of the first blocking band Br may also be appropriately deviated from the first emission center wavelength λlr of the first color light lr, that is, the first emission center wavelength λlr and the first blocking center wavelength λBr have a first difference value Δλ1, and the first difference value Δλ1 may fall within an appropriate range; the second blocking center wavelength λBg of the second blocking band Bg may also be appropriately deviated from the second emission center wavelength λlg of the second color light lg, that is, the second emission center wavelength λlg and the second blocking center wavelength λBg have a second difference value Δλ2, and the second difference value Δλ2 may fall within an appropriate range; the third blocking center wavelength λBb of the third blocking band Bb may also be appropriately deviated from the third emission center wavelength λlb of the third color light lb, that is, the third emission center wavelength λlb and the third blocking center wavelength λBb have a third difference value Δλ3, and the third difference value Δλ3 may fall within an appropriate range.

Figure 5:
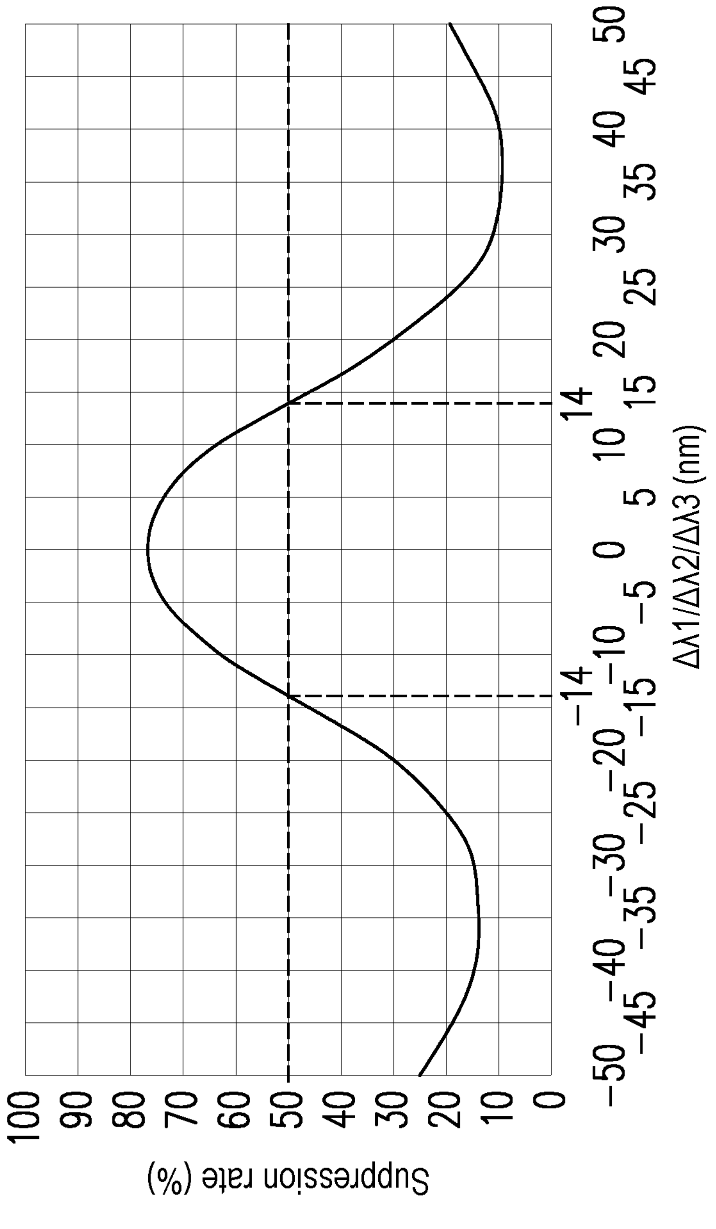
FIG. 5 shows the relationship between a first difference value, a second difference value, and a third difference value and a suppression rate of a first frequency band blocking filter of an embodiment of the invention.

FIG. 5 shows the relationship between the first difference value Δλ1, the second difference value Δλ2, and the third difference value Δλ3 and the suppression rate of the first frequency band blocking filter 150 of an embodiment of the invention. It may be seen from FIG. 5 that when the first difference value Δλ1, the second difference value Δλ2, and the third difference value Δλ3 fall within the range of −14 nm to 14 nm, the suppression rate of the first frequency band blocking filter 150 is greater than or equal to 50%. That is, when the first blocking center wavelength λBr of the first blocking band Br deviates from the first emission center wavelength λlr of the first color light lr within ±14 nm, the first frequency band blocking filter 150 may still effectively suppress the backside light leakage of the first color light lr; when the second blocking center wavelength λBg of the second blocking band Bg deviates from the second emission center wavelength λlg of the second color light lg within ±14 nm, the first frequency band blocking filter 150 may still effectively suppress the backside light leakage of the second color light lg; when the third blocking center wavelength λBb of the third blocking band Bb deviates from the third emission center wavelength λlb of the third color light lb within ±14 nm, the first frequency band blocking filter 150 may still effectively suppress the backside light leakage of the third color light lb.

It should be mentioned that, the embodiments below adopt the same reference numerals and portions of the content from previous embodiments. Specifically, the same reference numerals are used to represent the same or similar elements, and the descriptions for the same techniques are omitted. The omitted portions are as described in the embodiments above and are not repeated in the embodiments below.

Figure 6:
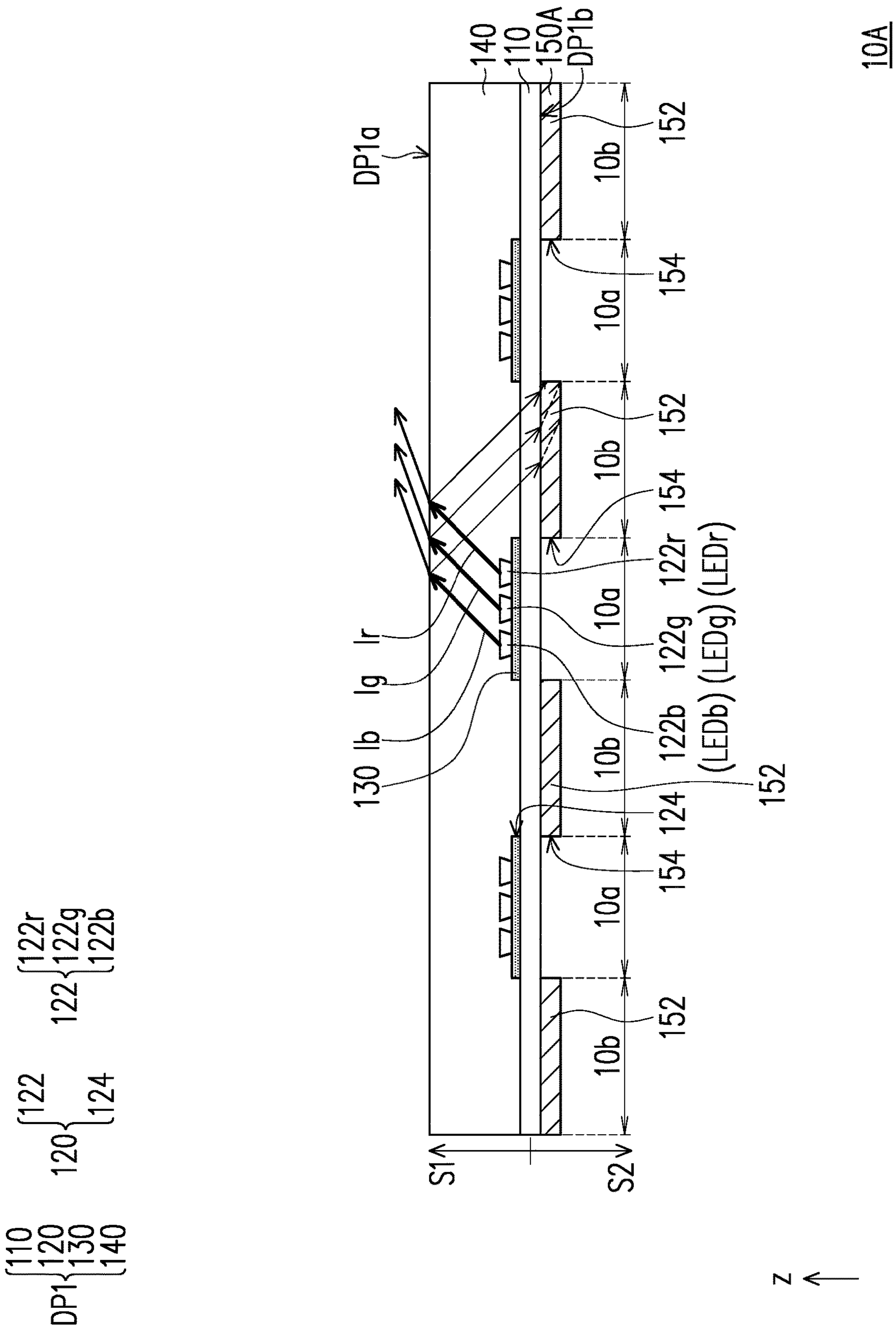
FIG. 6 is a schematic cross-sectional view of a transparent display apparatus of another embodiment of the invention.

FIG. 6 is a schematic cross-sectional view of a transparent display apparatus 10A of another embodiment of the invention. The transparent display apparatus 10A of FIG. 6 is similar to the transparent display apparatus 10 of FIG. 1. The difference between the two is that a first frequency band blocking filter 150A of FIG. 6 is different from the first frequency band blocking filter 150 of FIG. 1.

Specifically, in the embodiment of FIG. 1, the first frequency band blocking filter 150 is comprehensive and not patterned. However, in the embodiment of FIG. 6, the first frequency band blocking filter 150A is patterned. Specifically, in the embodiment of FIG. 6, the first frequency band blocking filter 150A includes a solid portion 152 and an opening portion 154, the solid portion 152 of the first frequency band blocking filter 150A is overlapped with the first transparent area 10*b* of the first transparent display panel DP1, and the opening portion 154 of the first frequency band blocking filter 150 is overlapped with the first display areas 10*a* of the first transparent display panel DP1.

Figure 7:
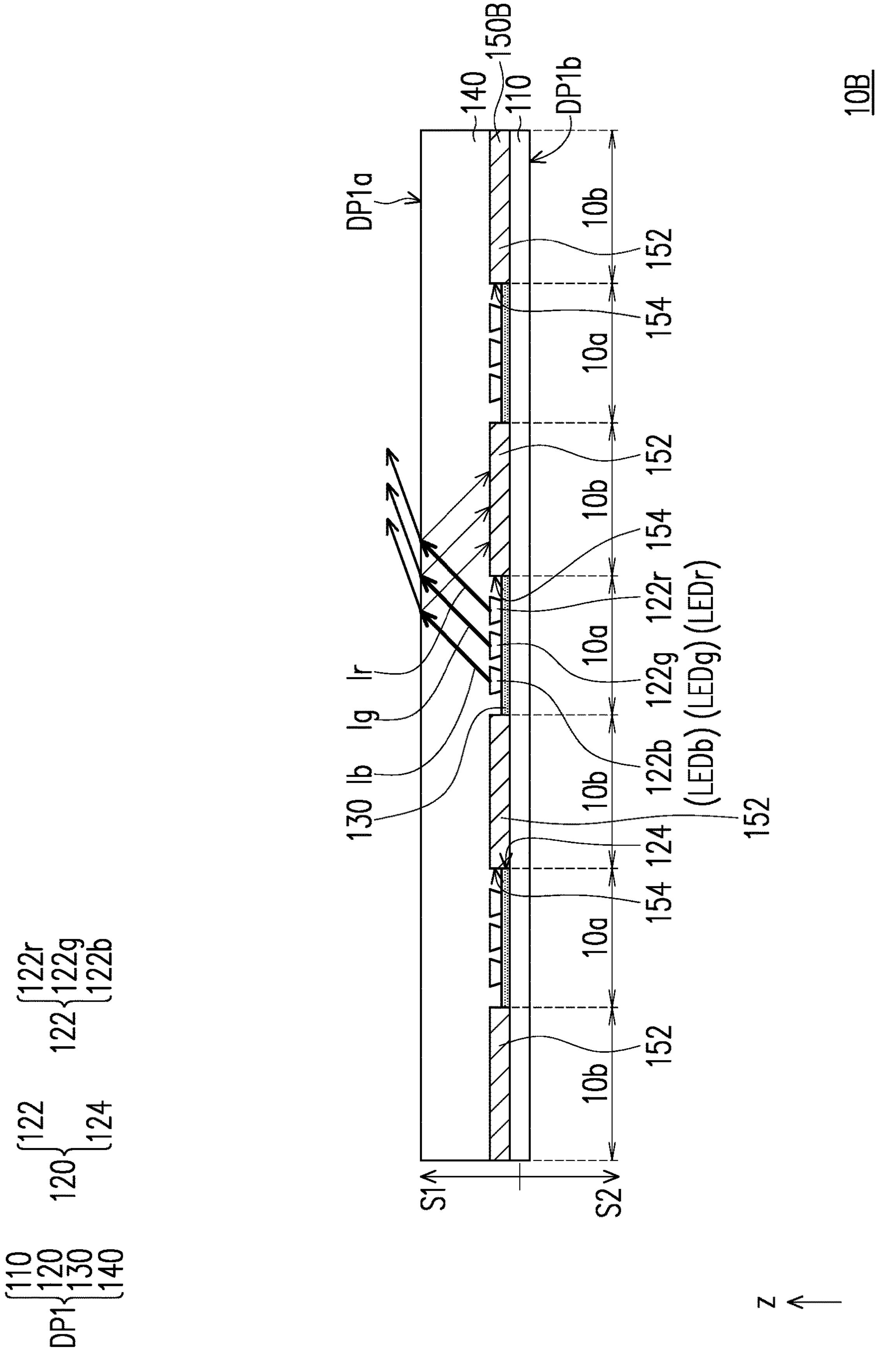
FIG. 7 is a schematic cross-sectional view of a transparent display apparatus of an embodiment of the invention.

FIG. 7 is a schematic cross-sectional view of a transparent display apparatus 10B of another embodiment of the invention. The transparent display apparatus 10B of FIG. 7 is similar to the transparent display apparatus 10A of FIG. 6. The difference between the two is that the position of a first frequency band blocking filter 150B of FIG. 7 is different from the position of the first frequency band blocking filter 150A of FIG. 6.

Specifically, in the embodiment of FIG. 6, the first frequency band blocking filter 150A is located at the second side S2 of the first transparent substrate 110 and disposed at the backside DP1*b* of the first transparent display panel DP1. However, in the embodiment of FIG. 7, the first frequency band blocking filter 150B is disposed at the first side S1 of the first transparent substrate 110 and located inside the first transparent display panel DP1. Specifically, in the embodiment of FIG. 7, the first transparent packaging element 140 covers the first light-emitting element LEDr, the second light-emitting element LEDg, the third light-emitting element LEDb, and the first transparent areas 10*b* of the first transparent substrate 110, and the first frequency band blocking filter 150B is disposed between the first transparent packaging element 140 and the first transparent substrate 110.

Figure 8:
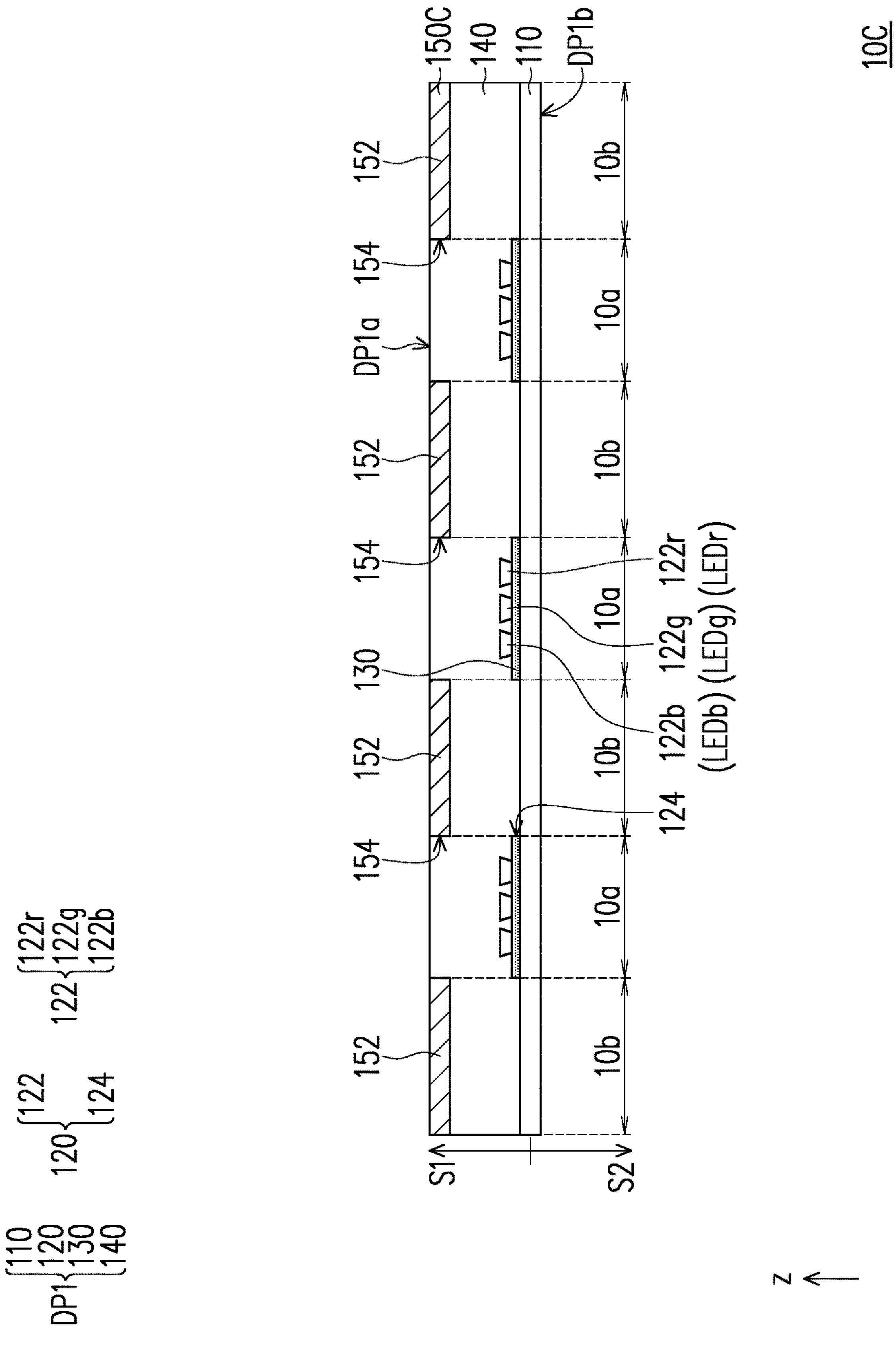
FIG. 8 is a schematic cross-sectional view of a transparent display apparatus of an embodiment of the invention.

FIG. 8 is a schematic cross-sectional view of a transparent display apparatus 10C of an embodiment of the invention. The transparent display apparatus 10C of FIG. 8 is similar to the transparent display apparatus 10A of FIG. 6. The difference between the two is that the position of a first frequency band blocking filter 150C of FIG. 8 is different from the position of the first frequency band blocking filter 150A of FIG. 6.

Specifically, in the embodiment of FIG. 8, the first frequency band blocking filter 150C is disposed on the first transparent packaging element 140, and the first transparent packaging element 140 is disposed between the first frequency band blocking filter 150C and the first transparent substrate 110. That is, the first frequency band blocking filter 150C is disposed in front of the first transparent display panel DP1.

Figure 9:
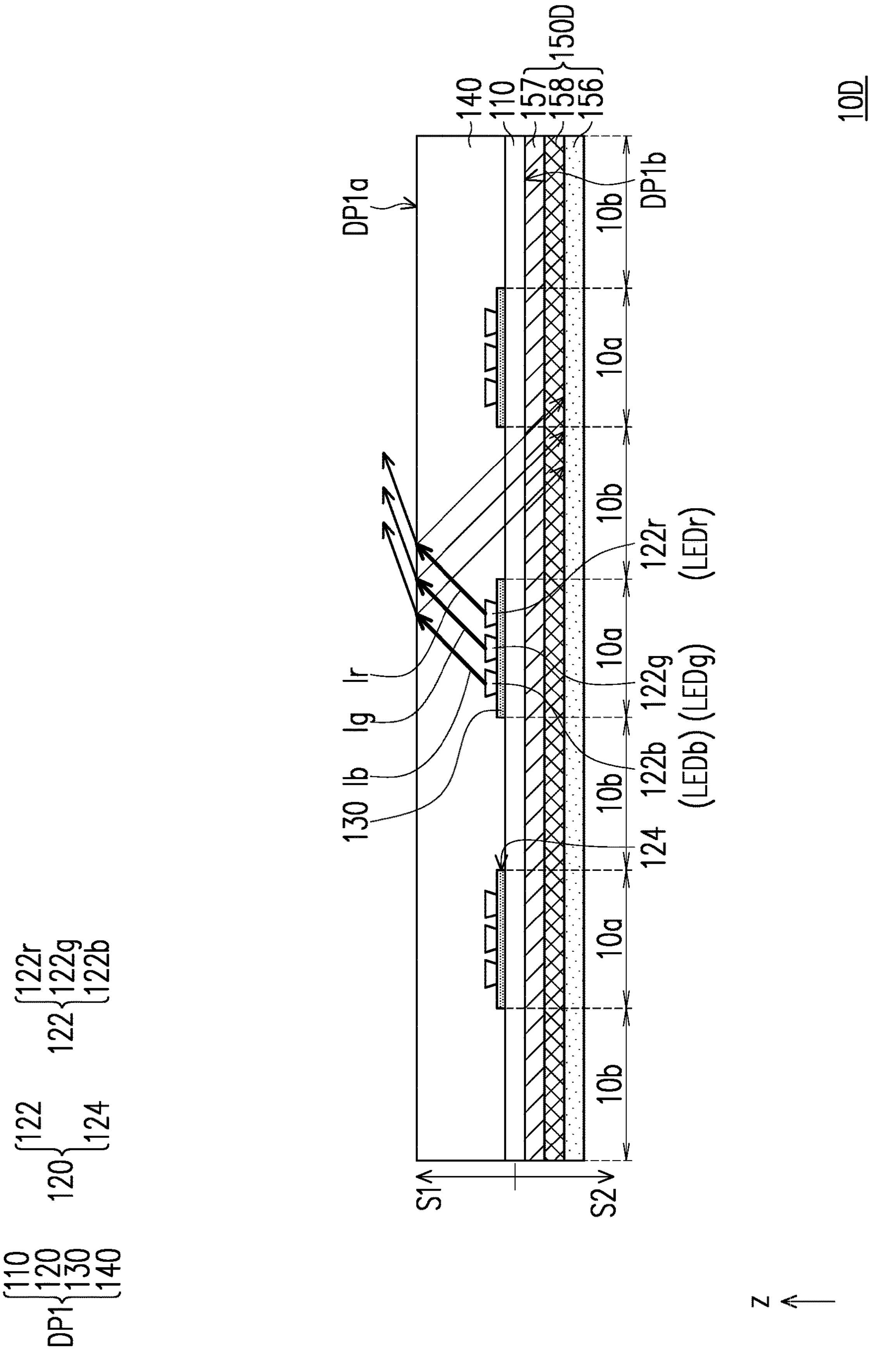
FIG. 9 is a schematic cross-sectional view of a transparent display apparatus of an embodiment of the invention.

FIG. 9 is a schematic cross-sectional view of a transparent display apparatus 10D of an embodiment of the invention. The transparent display apparatus 10D of FIG. 9 is similar to the transparent display apparatus 10 of FIG. 1. The difference between the two is that a first frequency band blocking filter 150D of FIG. 9 is different from the first frequency band blocking filter 150 of FIG. 1.

Specifically, in the embodiment of FIG. 9, the first frequency band blocking filter 150D includes a first frequency band blocking filter film 156, a second frequency band blocking filter film 157, and a third frequency band blocking filter film 158 stacked on each other, and the first frequency band blocking filter film 156, the second frequency band blocking filter film 157, and the third frequency band blocking filter film 158 respectively have the first blocking band Br (refer to FIG. 3), the second blocking band Bg (refer to FIG. 3), and the third blocking band Bb (refer to FIG. 3).

In other words, in the embodiment of FIG. 9, the first frequency band blocking filter 150D is formed by a plurality of layers of frequency band blocking filter films respectively used for suppressing the backside light leakage of the first color light lr, the second color light lg, and the third color light lb.

In the embodiment of FIG. 9, the first frequency band blocking filter film 156, the third frequency band blocking filter film 158, and the second frequency band blocking filter film 157 are optionally stacked in sequence along the third direction z. However, the invention does not limit the stacking order of the first frequency band blocking filter film 156, the second frequency band blocking filter film 157, and the third frequency band blocking filter film 158. In other embodiments, the first frequency band blocking filter film 156, the second frequency band blocking filter film 157, and the third frequency band blocking filter film 158 may also be stacked in any other order.

Figure 10:
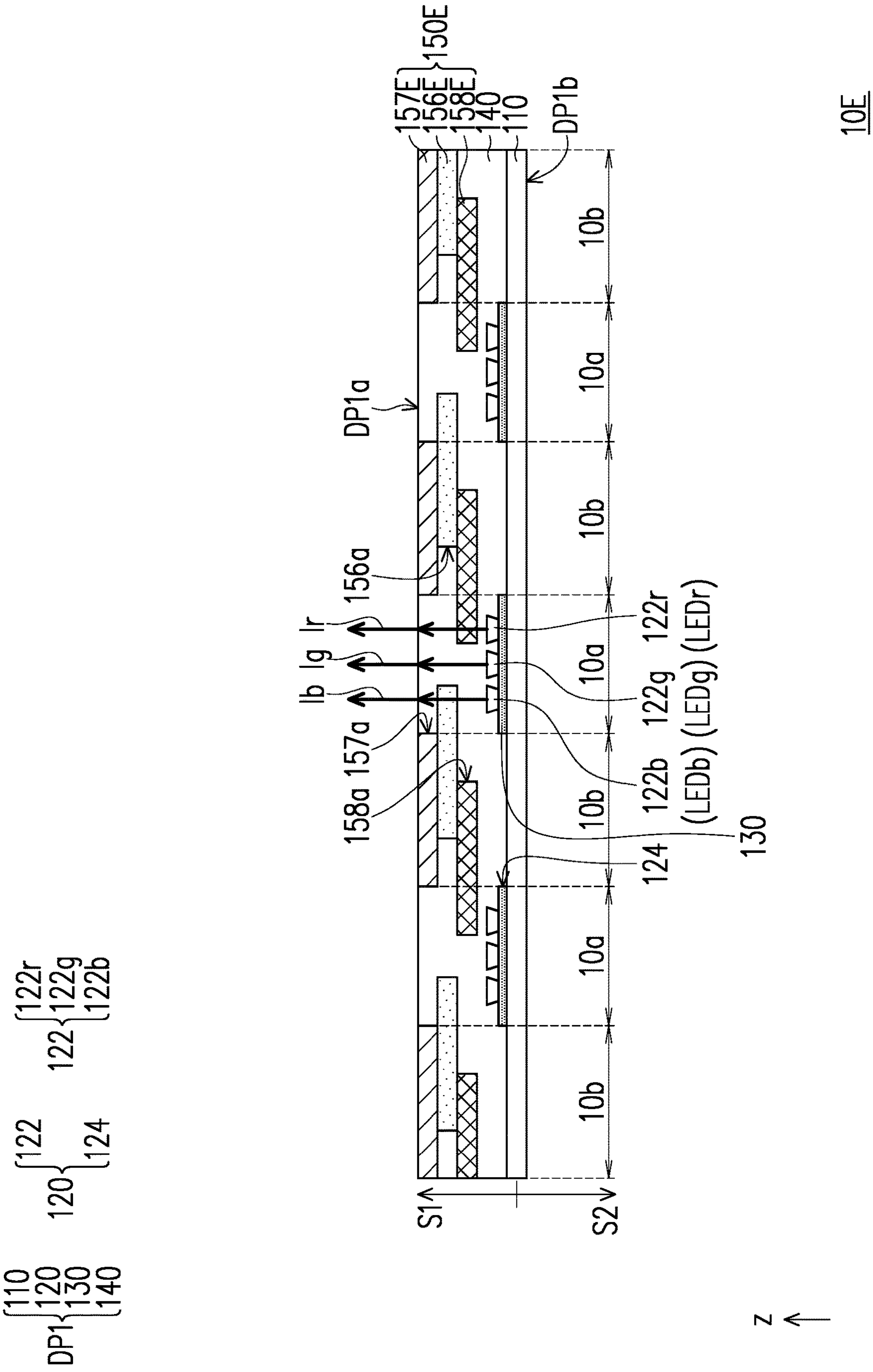
FIG. 10 is a schematic cross-sectional view of a transparent display apparatus of another embodiment of the invention.

FIG. 10 is a schematic cross-sectional view of a transparent display apparatus 10E of another embodiment of the invention. The transparent display apparatus 10E of FIG. 10 is similar to the transparent display apparatus 10D of FIG. 9. The difference between the two is that a first frequency band blocking filter 150E of FIG. 10 is different from the first frequency band blocking filter 150D of FIG. 9.

Specifically, in the embodiment of FIG. 10, the first frequency band blocking filter 150E includes a first frequency band blocking filter film 156E, a second frequency band blocking filter film 157E, and a third frequency band blocking filter film 158E stacked on each other, the first frequency band blocking filter film 156E, the second frequency band blocking filter film 157E, and the third frequency band blocking filter film 158E stacked on each other are disposed on the first transparent packaging element 140, and the first frequency band blocking filter film 156E, the second frequency band blocking filter film 157E, and the third frequency band blocking filter film 158E respectively have a first opening portion 156*a*, a second opening portion 157*a*, and a third opening portion 158*a*.

The first opening portion 156*a*, the second opening portion 157*a*, and the third opening portion 158*a* of the first frequency band blocking filter film 156E, the second frequency band blocking filter film 157E, and the third frequency band blocking filter film 158E are at least partially overlapped. The first opening portion 156*a*, the second opening portion 157*a*, and the third opening portion 158*a* of the first frequency band blocking filter film 156E, the second frequency band blocking filter film 157E, and the third frequency band blocking filter film 158E are offset from each other.

The geometric center of the first opening portion 156*a* of the first frequency band blocking filter film 156E is substantially aligned with the first light-emitting element LEDr in the third direction z. The geometric center of the second opening portion 157*a* of the second frequency band blocking filter film 157E is substantially aligned with the second light-emitting element LEDg in the third direction z. The geometric center of the third opening portion 158*a* of the third frequency band blocking filter film 158E is substantially aligned with the third light-emitting element LEDb in the third direction z.

Figure 11:
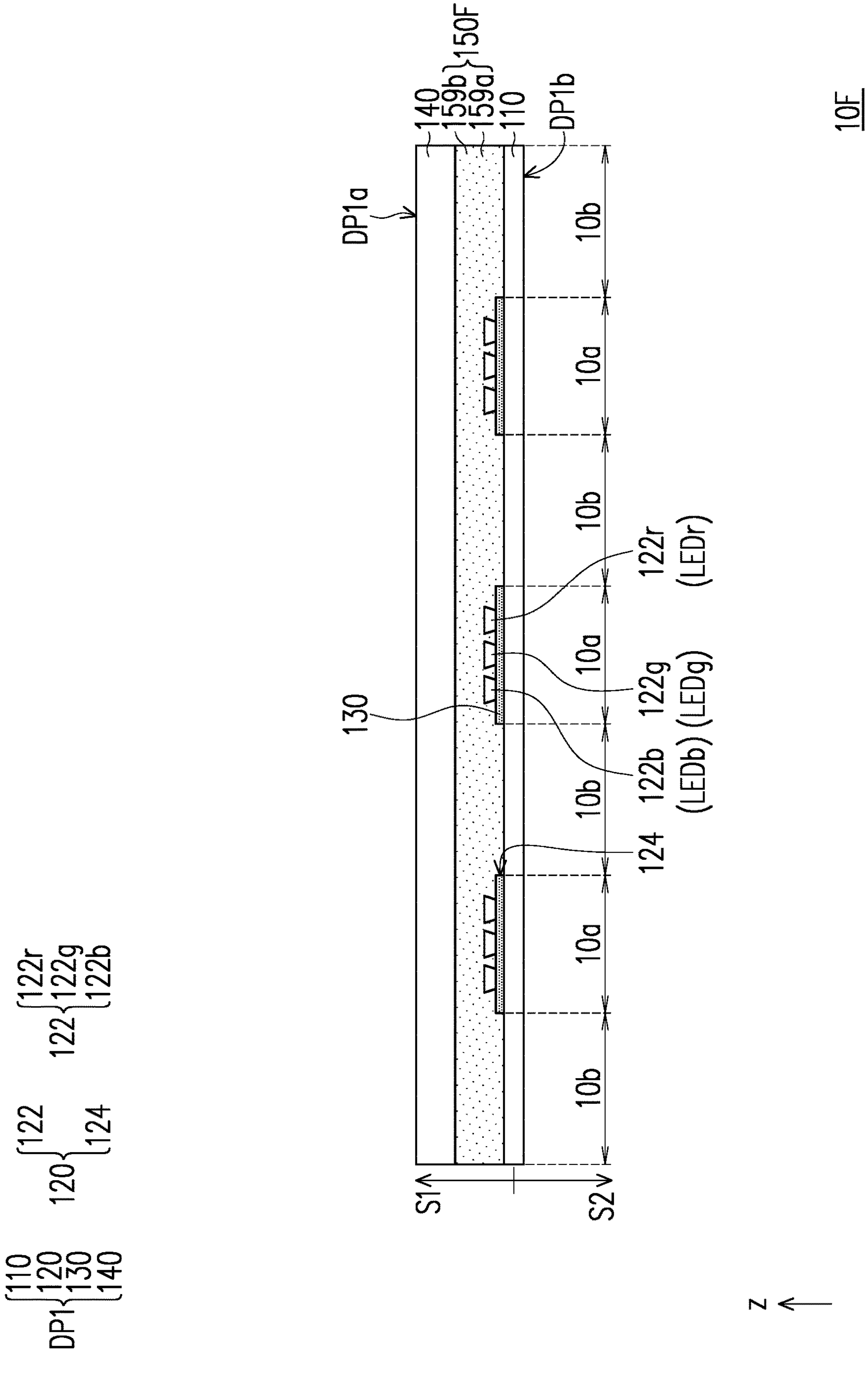
FIG. 11 is a schematic cross-sectional view of a transparent display apparatus of an embodiment of the invention.

FIG. 11 is a schematic cross-sectional view of a transparent display apparatus 10F of an embodiment of the invention. The transparent display apparatus 10F of FIG. 11 is similar to the transparent display apparatus 10 of FIG. 1. The difference between the two is that a first frequency band blocking filter 150F of FIG. 11 is different from the first frequency band blocking filter 150 of FIG. 1.

Specifically, in the embodiment of FIG. 11, the first frequency band blocking filter 150F is disposed at the first side S1 of the first transparent substrate 110 and located between the first transparent packaging element 140 and the first transparent substrate 110. The first frequency band blocking filter 150F includes a light-transmitting base material 159*a* covering the first light-emitting element LEDr, the second light-emitting element LEDg, and the third light-emitting element LEDb and a frequency band blocking material 159*b* mixed in the light-transmitting base material 159*a*. The frequency band blocking material 159*b* is doped in a thick film layer (i.e., the light-transmitting base material 159*a*). Since the first color light lr, the second color light lg, and the third color light lb emitted at a large angle have a long transmission path in the thick film layer (i.e., the light-transmitting base material 159*a*), the probability of being absorbed is high, and therefore the first frequency band blocking filter 150F has a better suppression effect on light leakage at large angles.

Figure 12:
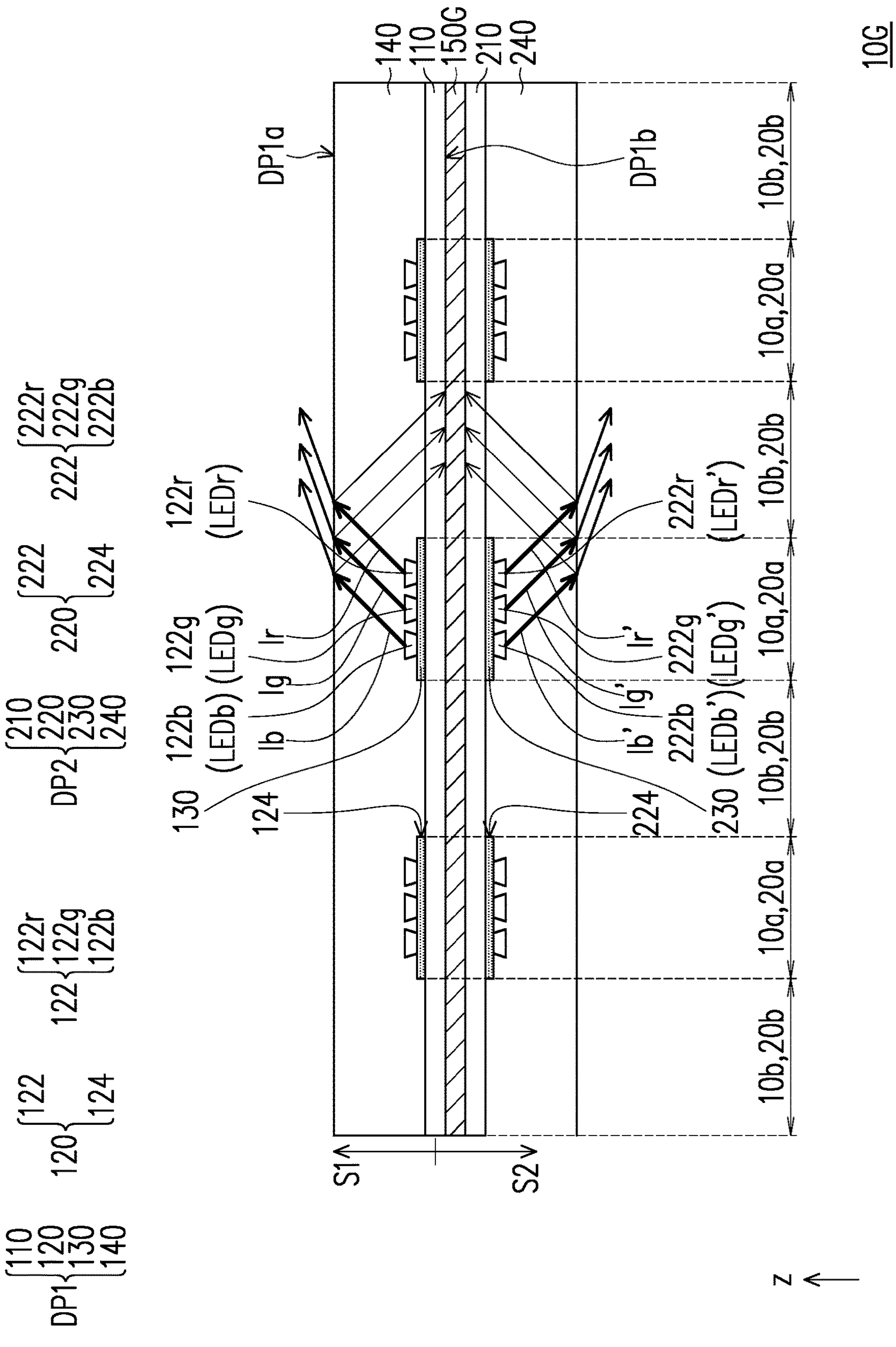
FIG. 12 is a schematic cross-sectional view of a transparent display apparatus of an embodiment of the invention.

FIG. 12 is a schematic cross-sectional view of a transparent display apparatus 10G of an embodiment of the invention. The transparent display apparatus 10G of FIG. 12 is similar to the transparent display apparatus 10 of FIG. 1. The difference between the two is: the transparent display apparatus 10G of FIG. 12 further includes a second transparent display panel DP2 disposed at the second side S2 of the first transparent substrate 110, wherein a second pixel array 220 of the second transparent display panel DP2 is disposed at the second side S2 of the first transparent substrate 110, and the first frequency band blocking filter 150 is located between the first pixel array 120 of the first transparent display panel DP1 and the second pixel array 220 of the second transparent display panel DP2.

Please refer to FIG. 12. Specifically, the second transparent display panel DP2 includes a second transparent substrate 210, a second circuit structure 230, the second pixel array 220, and a second transparent packaging element 240. The second transparent substrate 210 of the second transparent display panel DP2 is disposed at the second side S2 of the first transparent substrate 110 and has a plurality of second display areas 20*a* and a plurality of second transparent areas 20*b*. The plurality of second display areas 20*a* and the plurality of second transparent areas 20*b* of the second transparent substrate 210 of the second display panel DP2 are respectively overlapped with the plurality of first display areas 10*a* and the plurality of first transparent areas 10*b* of the first transparent substrate 110 of the first transparent display panel DP1. The second pixel array 220 is disposed on the second transparent substrate 210 and includes a plurality of second pixels 222 and a plurality of second openings 224. The plurality of second pixels 222 and the plurality of second openings 224 of the second transparent display panel DP2 are overlapped with the plurality of first pixels 122 and the plurality of first openings 124 of the first display panel DP1 respectively. The second circuit structure 230 is disposed on the second transparent substrate 210 and electrically connected to the plurality of second pixels 222. The second circuit structure 230 of the second transparent display panel DP2 is overlapped with the first circuit structure 130 of the first transparent display panel DP1. The second transparent packaging element 240 covers the plurality of second pixels 222. Each of the second pixels 222 may include a plurality of sub-pixels 222*r*, 222*g*, and 222*b* respectively used for emitting a fourth color light lr', a fifth color light lg', and a sixth color light lb'. The sub-pixels 222*r*, 222*g*, and 222*b* respectively include a fourth light-emitting element LEDr', a fifth light-emitting element LEDg', and a sixth light-emitting element LEDb'. The fourth light-emitting element LEDr', the fifth light-emitting element LEDg', and the sixth light-emitting element LEDb' are disposed on the second display areas 20*a* of the second transparent substrate 210. The fourth light-emitting element LEDr', the fifth light-emitting element LEDg', and the sixth light-emitting element LEDb' are respectively used for emitting the fourth color light lr', the fifth color light lg', and the sixth color light lb' toward the second side S2 of the first transparent substrate 110. In the embodiment of FIG. 12, the emission spectrum of the first color light lr and the emission spectrum of the fourth color light lr' may optionally be substantially the same, the emission spectrum of the second color light lg and the emission spectrum of the fifth color light lg' may optionally be substantially the same, and the emission spectrum of the third color light lb and the emission spectrum of the sixth color light lb' may optionally be substantially the same.

The first frequency band blocking filter 150G is disposed between the first transparent substrate 110 of the first transparent display panel DP1 and the second transparent substrate 210 of the second transparent display panel DP2. The transparent display apparatus 10G includes the first transparent display panel DP1 and the second transparent display panel DP2. That is, the transparent display apparatus 10G is a double-sided display. The first frequency band blocking filter 150G may be applied in the double-sided display to suppress backside light leakage of the first transparent display panel DP1 and the second transparent display panel DP2.

Figure 13:
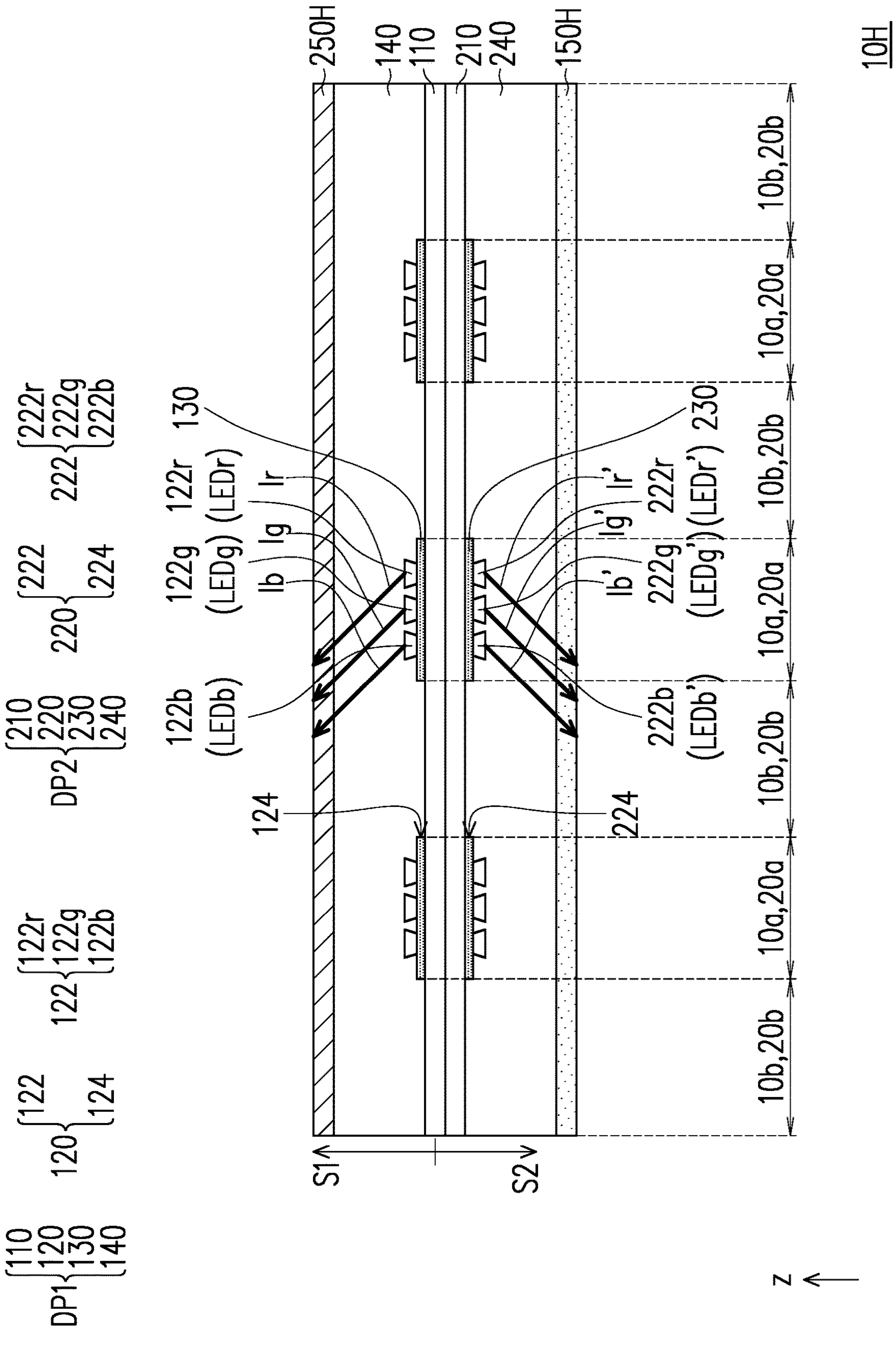
FIG. 13 is a schematic cross-sectional view of a transparent display apparatus of an embodiment of the invention.
Figure 14:
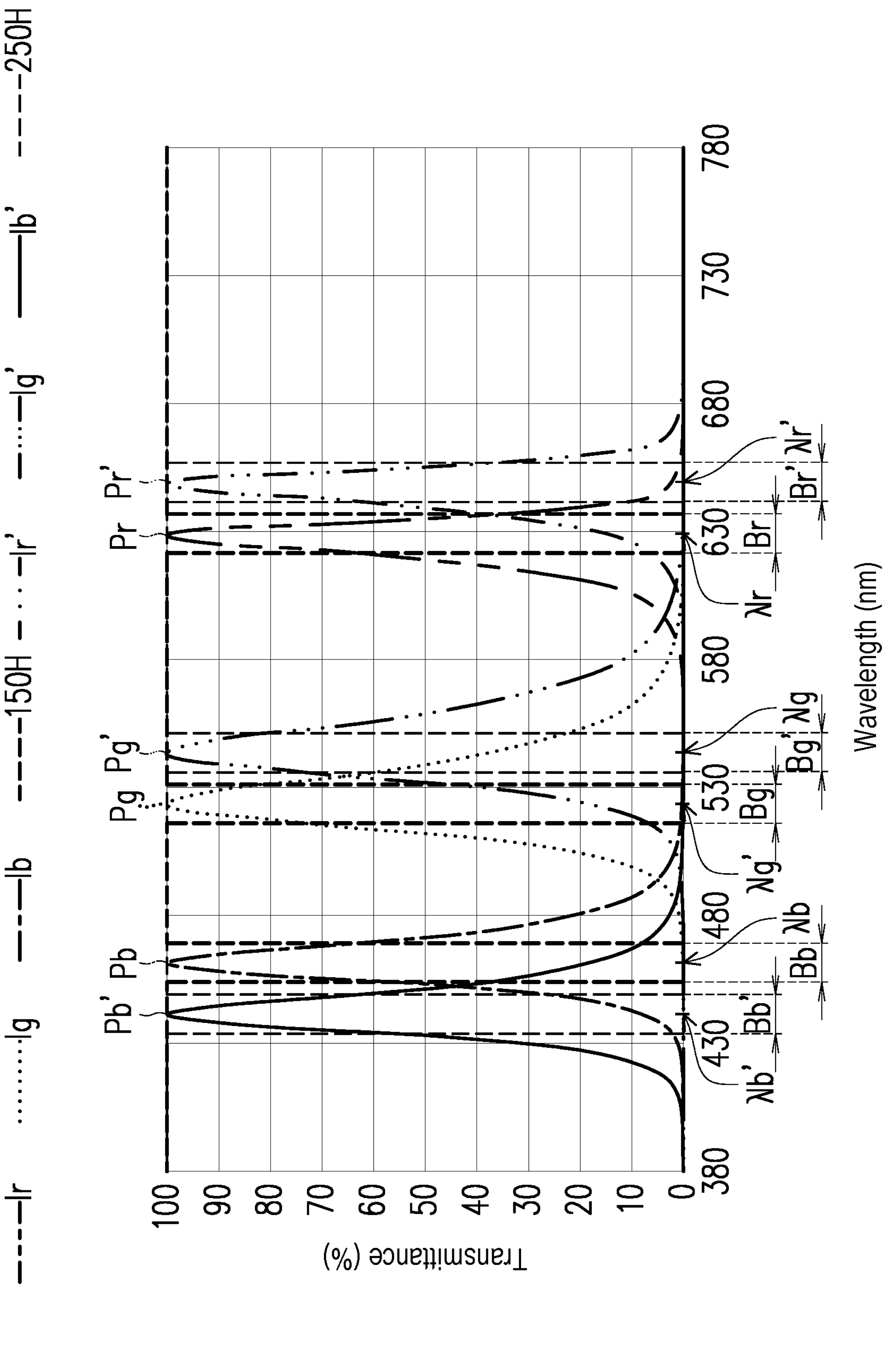
FIG. 14 shows the emission spectra of a first color light, a second color light, a third color light, a fourth color light, a fifth color light, and a sixth color light emitted by a first light-emitting element, a second light-emitting element, a third light-emitting element, a fourth light-emitting element, a fifth light-emitting element, and a sixth light-emitting element and the transmission spectra of a first frequency band blocking filter and a second frequency band blocking filter of an embodiment of the invention.

FIG. 13 is a schematic cross-sectional view of a transparent display apparatus 10H of an embodiment of the invention. FIG. 14 shows the emission spectra of the first color light lr, the second color light lg, the third color light lb, the fourth color light lr', the fifth color light lg', and the sixth color light lb' emitted by the first light-emitting element LEDr, the second light-emitting element LEDg, the third light-emitting element LEDb, the fourth light-emitting element LEDr', the fifth light-emitting element LEDg', and the sixth light-emitting element LEDb' and the transmission spectra of the first frequency band blocking filter 150H and the second frequency band blocking filter 250H of an embodiment of the invention.

The transparent display apparatus 10H of FIG. 13 is similar to the transparent display apparatus 10G of FIG. 12, and the differences between the two are explained as follows.

Referring to FIG. 13 and FIG. 14, the emission spectrum of the first color light lr of the first transparent display panel DP1 is partially overlapped with the emission spectrum of the fourth color light lr' of the second transparent display panel DP2. The emission spectrum of the first color light lr of the first transparent display panel DP1 has the first peak value Pr at the first emission center wavelength λlr, the emission spectrum of the fourth color light lr' of the second transparent display panel DP2 has a fourth peak value Pr' at a fourth emission center wavelength λlr', and the first emission center wavelength λlr is different from the fourth emission center wavelength λlr'. The emission spectrum of the second color light lg of the first transparent display panel DP1 is partially overlapped with the emission spectrum of the fifth color light lg' of the second transparent display panel DP2. The emission spectrum of the second color light lg of the first transparent display panel DP1 has the second peak value Pg at the second emission center wavelength λlg, the emission spectrum of the fifth color light lg' of the second transparent display panel DP2 has a fifth peak value Pg' at a fifth emission center wavelength λlg', and the second emission center wavelength λlg is different from the fifth emission center wavelength λlg'. The emission spectrum of the third color light lb of the first transparent display panel DP1 is partially overlapped with the emission spectrum of the sixth color light lb' of the second transparent display panel DP2. The emission spectrum of the third color light lb of the first transparent display panel DP1 has the third peak value Pb at the third emission center wavelength λlb, the emission spectrum of the sixth color light lb' of the second transparent display panel DP2 has a sixth peak value Pb' at a sixth emission center wavelength λlb', and the third emission center wavelength λlb is different from the sixth emission center wavelength λlb'.

The first frequency band blocking filter 150H has the first blocking band Br, the second blocking band Bg, and the third blocking band Bb respectively corresponding to the first color light lr, the second color light lg, and the third color light lb. The first emission center wavelength λlr falls within the first blocking band Br of the first frequency band blocking filter 150H. The second emission center wavelength λlg falls within the second blocking band Bg of the first frequency band blocking filter 150H. The third emission center wavelength λlb falls within the third blocking band Bb of the first frequency band blocking filter 150H.

The second frequency band blocking filter 250H has a fourth blocking band Br', a fifth blocking band Bg', and a sixth blocking band Bb' respectively corresponding to the fourth color light lr', the fifth color light lg', and the sixth color light lb'. The fourth emission center wavelength λlr' falls within the fourth blocking band Br' of the second frequency band blocking filter 250H. The fifth emission center wavelength λlg' falls within the fifth blocking band Bg' of the second frequency band blocking filter 250H. The sixth emission center wavelength λlb' falls within the sixth blocking band Bb' of the second frequency band blocking filter 250H.

The first frequency band blocking filter 150H of the transparent display apparatus 10H is disposed at the second side S2 of the first transparent substrate 110. Specifically, the first frequency band blocking filter 150H may be disposed on the second transparent packaging element 240 of the second transparent display panel DP2, and the second transparent packaging element 240 is located between the first frequency band blocking filter 150H and the second transparent substrate 210. The second frequency band blocking filter 250H is disposed at the first side S1 of the first transparent substrate 110. Specifically, the second frequency band blocking filter 250H may be disposed on the first transparent packaging element 140 of the first transparent display panel DP1, and the first transparent packaging element 140 is located between the second frequency band blocking filter 250H and the first transparent substrate 110.

In short, in the embodiment of FIG. 13, the emission spectra of the first color light lr, the second color light lg, and the third color light lb of the first transparent display panel DP1 are respectively slightly offset from the emission spectra of the fourth color light lr', the fifth color light lg', and the sixth color light lb' of the second transparent display panel DP2, the transmission spectrum of the first frequency band blocking filter 150H and the transmission spectrum of the second frequency band blocking filter 250H are also correspondingly slightly offset, and the first frequency band blocking filter 150H and the second frequency band blocking filter 250H are respectively disposed at the backsides of the first transparent display panel DP1 and the second transparent display panel DP2 to respectively suppress the light leakage of the first color light lr, the second color light lg, and the third color light lb at the backside of the first transparent display panel DP1 and the light leakage of the fourth color light lr', the fifth color light lg', and the sixth color light lb' at the backside of the second transparent display panel DP2.

What is claimed is:

1. A transparent display apparatus, comprising:

a first transparent substrate having a first display area and a first transparent area outside the first display area;

a first light-emitting element, a second light-emitting element, and a third light-emitting element disposed at the first display area and respectively used for emitting a first color light, a second color light, and a third color light; and a first frequency band blocking filter disposed on a transmission path of the first color light, the second color light, and the third color light;

wherein the first frequency band blocking filter has a first blocking band, a second blocking band, and a third blocking band respectively corresponding to the first color light, the second color light, and the third color light, and an FWHM of the first blocking band, an FWHM of the second blocking band, and an FWHM of the third blocking band fall within a range of 15 nm to 55 nm.

2. The transparent display apparatus of claim 1, wherein an emission spectrum of the first color light has a first peak value at a first emission center wavelength, a transmission spectrum of the first frequency band blocking filter has a first blocking center wavelength at the first blocking band, the first emission center wavelength and the first blocking center wavelength have a first difference value, and the first difference value falls within a range of −14 nm to 14 nm; an emission spectrum of the second color light has a second peak value at a second emission center wavelength, the transmission spectrum of the first frequency band blocking filter has a second blocking center wavelength at the second blocking band, the second emission center wavelength and the second blocking center wavelength have a second difference value, and the second difference value falls within a range of −14 nm to 14 nm; and an emission spectrum of the third color light has a third peak value at a third emission center wavelength, the transmission spectrum of the first frequency band blocking filter has a third blocking center wavelength at the third blocking band, the third emission center wavelength and the third blocking center wavelength have a third difference value, and the third difference value falls within a range of −14 nm to 14 nm.

3. The transparent display apparatus of claim 1, wherein the first transparent substrate has a first side and a second side opposite to each other, the first light-emitting element, the second light-emitting element, and the third light-emitting element emit the first color light, the second color light, and the third color light toward the first side, and the first frequency band blocking filter is disposed at the second side of the first transparent substrate.

4. The transparent display apparatus of claim 1, wherein the first transparent substrate has a first side and a second side opposite to each other, the first light-emitting element, the second light-emitting element, and the third light-emitting element emit the first color light, the second color light, and the third color light toward the first side, and the first frequency band blocking filter is disposed at the first side of the first transparent substrate.

5. The transparent display apparatus of claim 4, further comprising:

a first transparent packaging element covering the first light-emitting element, the second light-emitting element, the third light-emitting element, and the first transparent area of the first transparent substrate;

wherein the first frequency band blocking filter is disposed between the first transparent packaging element and the first transparent substrate.

6. The transparent display apparatus of claim 4, further comprising:

a first transparent packaging element covering the first light-emitting element, the second light-emitting element, the third light-emitting element, and the first transparent area of the first transparent substrate;

wherein the first transparent packaging element is disposed between the first frequency band blocking filter and the first transparent substrate.

7. The transparent display apparatus of claim 1, wherein the first frequency band blocking filter comprises a solid portion and an opening portion, the solid portion of the first frequency band blocking filter is overlapped with the first transparent area, and the opening portion of the first frequency band blocking filter is overlapped with the first display area.

8. The transparent display apparatus of claim 1, wherein the first frequency band blocking filter comprises a first frequency band blocking filter film, a second frequency band blocking filter film, and a third frequency band blocking filter film stacked on each other, and the first frequency band blocking filter film, the second frequency band blocking filter film, and the third frequency band blocking filter film respectively have the first blocking band, the second blocking band, and the third blocking band.

9. The transparent display apparatus of claim 8, wherein the first frequency band blocking filter film, the second frequency band blocking filter film, and the third frequency band blocking filter film respectively have a first opening portion, a second opening portion, and a third opening portion, and the first opening portion, the second opening portion, and the third opening portion are at least partially overlapped.

10. The transparent display apparatus of claim 9, wherein the first opening portion, the second opening portion, and the third opening portion are offset from each other.

11. The transparent display apparatus of claim 10, wherein a geometric center of the first opening portion of the first frequency band blocking filter film is substantially aligned with the first light-emitting element, a geometric center of the second opening portion of the second frequency band blocking filter film is substantially aligned with the second light-emitting element, and a geometric center of the third opening portion of the third frequency band blocking filter film is substantially aligned with the third light-emitting element.

12. The transparent display apparatus of claim 1, wherein the first frequency band blocking filter comprises:

a light-transmitting base material covering the first light-emitting element, the second light-emitting element, and the third light-emitting element; and a frequency band blocking material mixed in the light-transmitting base material.

13. The transparent display apparatus of claim 1, wherein the first transparent substrate has a first side and a second side opposite to each other, the first light-emitting element, the second light-emitting element, and the third light-emitting element emit the first color light, the second color light, and the third color light toward the first side of the first transparent substrate, and the transparent display apparatus further comprises:

a second transparent substrate disposed at the second side of the first transparent substrate and having a second display area and a second transparent area outside the second display area, wherein the first display area and the first transparent area of the first transparent substrate are overlapped with the second display area and the second transparent area of the second transparent substrate respectively;

a fourth light-emitting element, a fifth light-emitting element, and a sixth light-emitting element disposed on the second display area of the second transparent substrate and respectively used for emitting a fourth color light, a fifth color light, and a sixth color light toward the second side of the first transparent substrate, wherein an emission spectrum of the first color light is substantially the same as an emission spectrum of the fourth color light, an emission spectrum of the second color light is substantially the same as an emission spectrum of the fifth color light, and an emission spectrum of the third color light is substantially the same as an emission spectrum of the sixth color light;

the first frequency band blocking filter is disposed between the first transparent substrate and the second transparent substrate.

14. The transparent display apparatus of claim 1, wherein the first transparent substrate has a first side and a second side opposite to each other, the first light-emitting element, the second light-emitting element, and the third light-emitting element emit the first color light, the second color light, and the third color light toward the first side of the first transparent substrate, the first frequency band blocking filter is disposed at the second side of the first transparent substrate, an emission spectrum of the first color light has a first peak value at a first emission center wavelength, the first emission center wavelength falls within the first blocking band of the first frequency band blocking filter, an emission spectrum of the second color light has a second peak value at a second emission center wavelength, the second emission center wavelength falls within the second blocking band of the first frequency band blocking filter, an emission spectrum of the third color light has a third peak value at a third emission center wavelength, the third emission center wavelength falls within the third blocking band of the first frequency band blocking filter, and the transparent display apparatus further comprises:

a fourth light-emitting element, a fifth light-emitting element, and a sixth light-emitting element disposed at the second side of the first transparent substrate and respectively used for emitting a fourth color light, a fifth color light, and a sixth color light toward the second side of the first transparent substrate, wherein the emission spectrum of the first color light is partially overlapped with an emission spectrum of the fourth color light, the emission spectrum of the first color light has a first peak value at the first emission center wavelength, the emission spectrum of the fourth color light has a fourth peak value at a fourth emission center wavelength, the first emission center wavelength is different from the fourth emission center wavelength, the emission spectrum of the second color light is partially overlapped with an emission spectrum of the fifth color light, the emission spectrum of the second color light has a second peak value at the second emission center wavelength, the emission spectrum of the fifth color light has a fifth peak value at a fifth emission center wavelength, the second emission center wavelength is different from the fifth emission center wavelength, the emission spectrum of the third color light is partially overlapped with an emission spectrum of the sixth color light, the emission spectrum of the third color light has a third peak value at the third emission center wavelength, the emission spectrum of the sixth color light has a sixth peak value at a sixth emission center wavelength, and the third emission center wavelength is different from the sixth emission center wavelength; and a second frequency band blocking filter, wherein the second frequency band blocking filter is disposed at the first side of the first transparent substrate, the second frequency band blocking filter has a fourth blocking band, a fifth blocking band, and a sixth blocking band respectively corresponding to the fourth color light, the fifth color light, and the sixth color light, the fourth emission center wavelength falls within the fourth blocking band of the second frequency band blocking filter, the fifth emission center wavelength falls within the fifth blocking band of the second frequency band blocking filter, and the sixth emission center wavelength falls within the sixth blocking band of the second frequency band blocking filter.

* * * * *